United States Patent [19]
Caprara et al.

[11] Patent Number: 6,167,068
[45] Date of Patent: *Dec. 26, 2000

[54] INTRACAVITY FREQUENCY-CONVERTED OPTICALLY-PUMPED SEMICONDUCTOR LASER

[75] Inventors: Andrea Caprara, Menlo Park; Juan L. Chilla; Luis A. Spinelli, both of Sunnyvale, all of Calif.

[73] Assignee: Coherent, Inc., Santa, Calif.

[*] Notice: This patent is subject to a terminal disclaimer.

[21] Appl. No.: 09/377,942

[22] Filed: Aug. 20, 1999

Related U.S. Application Data

[63] Continuation of application No. 09/179,022, Oct. 26, 1998, Pat. No. 5,991,318.

[51] Int. Cl.$^7$ ...................................................... H01S 3/10
[52] U.S. Cl. .......................... 372/22; 372/45; 372/105; 372/20; 372/93
[58] Field of Search ............................... 372/22, 45, 105, 372/20, 98, 93

[56] References Cited

U.S. PATENT DOCUMENTS

| | | | |
|---|---|---|---|
| 5,050,179 | 9/1991 | Mooradian | 372/44 |
| 5,131,002 | 7/1992 | Mooradian | 372/50 |
| 5,289,485 | 2/1994 | Mooradian | 372/45 |
| 5,331,002 | 7/1994 | Mooradian | 372/50 |
| 5,384,797 | 1/1995 | Welch et al. | 372/22 |
| 5,436,920 | 7/1995 | Minemoto et al. | |
| 5,461,637 | 10/1995 | Mooradian et al. | 372/45 |
| 5,627,853 | 5/1997 | Mooradian et al. | 372/92 |

FOREIGN PATENT DOCUMENTS

| | | | |
|---|---|---|---|
| 25 22 338 A1 | 12/1975 | Germany | H01S 3/10 |
| 42 28 862 A1 | 3/1994 | Germany | H01S 3/109 |
| 43 15 580 A1 | 11/1994 | Germany | H01S 3/043 |
| WO 93/14542 | 7/1993 | WIPO | H01S 3/109 |
| WO 94/15386 | 7/1994 | WIPO | H01S 3/094 |
| WO 95/25366 | 9/1995 | WIPO | H01S 3/085 |
| WO 98/43329 | 10/1998 | WIPO | H01S 3/085 |

OTHER PUBLICATIONS

Kuznetsov, M. et al., "High–Power (>0.5–W CW) Diode–Pumped Vertical–External–Cavity Surface–Emitting Semiconductor Lasers With Circular TEM$_{00}$ Beams," IEEE, Inc., New York, Vp;/ 9, No. 8, p. 1063–1065, XP000699799, Aug., 1997.

PCT International Search Report, mailed Feb. 25, 2000, for International Appln. No. PCT/US 99/24303, filed Oct. 18, 1999, 7 pages in length.

J.V. Sandusky & S.R.J. Brueck, "A CW External–Cavity Surface–Emitting Laser," *IEEE Photonics Technology Letters,* vol. 8, No. 3, Mar. 1996, pp. 313–315.

M. Kuznetsov, F. Hakimi, R. Sprague & A. Mooradian, "High–Power (>0.5–W CW) Diode–Pumped Vertical–External–Cavity Surface–Emitting Semiconductor Lasers with Circular TEM$_{00}$ Beams," *IEEE Photonics Technology Letters,* vol. 9, No. 8, Aug. 1997, pp. 1063–1065.

A. Rosiewicz, P. Crosby & J–M. Pelaprat, "Optical pumping improves VCSEL performance," *Laser Focus World,* Jun. 1997, pp. 133–136.

Wang–hua Xiang, et al., "Femtosecond external–cavity surface–emitting InGaAs/InP multiple–quantum–well laser," *Optics Letters,* vol. 16, No. 18, Sep. 15, 1991, pp. 1394–1396.

Copy of Jan. 1, 2000, Notification of Transmittal of the International Search Report or Declaration in PCT/US99/22960, 7 pages in length.

*Primary Examiner*—Leon Scott, Jr.
*Attorney, Agent, or Firm*—Limbach & Limbach LLP

[57] ABSTRACT

An intracavity, frequency-doubled, external-cavity, optically-pumped semiconductor laser in accordance with the present invention includes a monolithic surface-emitting semiconductor layer structure including a Bragg mirror portion and a gain portion. An external mirror and the Bragg-mirror portion define a laser resonant-cavity including the gain-portion of the semiconductor layer structure. A birefringent filter is located in the resonant-cavity for selecting a frequency of the laser-radiation within a gain bandwidth characteristic of semiconductor structure. An optically-nonlinear crystal is located in the resonant-cavity between the birefringent filter and the external mirror and arranged to double the selected frequency of laser-radiation.

31 Claims, 3 Drawing Sheets

FIG. 5

INTRACAVITY FREQUENCY-CONVERTED OPTICALLY-PUMPED SEMICONDUCTOR LASER

This is a continuation of Ser. No. 09/179,022, filed on Oct. 26, 1998, now U.S. Pat. No. 5,991,318.

TECHNICAL FIELD OF THE INVENTION

The present invention relates in general to external-cavity semiconductor lasers. It relates in particular to external-cavity, intracavity (IC) frequency-converted, surface-emitting semiconductor lasers, such as frequency-doubled lasers.

DISCUSSION OF BACKGROUND ART

Intracavity doubled semiconductor lasers are known in the prior art in two classes. One class is based on edge-emitting semiconductor lasers (diode-lasers), the other on vertical-cavity surface-emitting lasers (VCSEL), electrically-energized. In each class, in order to conveniently effect intracavity doubling, the resonant-cavity of the semiconductor laser must be extended beyond the semiconductor device, leaving free space in which an optically-nonlinear crystal can be located to effect frequency-doubling. This is usually effected by providing an antireflection coating on the emitting surface of the semiconductor laser (which would otherwise serve as an output coupling mirror) and by providing an external-mirror, spaced apart from that surface, to serve the same purpose. Such an arrangement is usually referred to as an external-cavity semiconductor laser.

The efficiency of frequency-conversion in an optically-nonlinear crystal is directly proportional to power (intensity) of the fundamental frequency incident on the crystal. This is the case whether conversion is doubling to a second harmonic frequency, frequency mixing to provide third or higher odd harmonic frequencies, or optical parametric oscillation (OPO). Because of this, for example, for a useful IC-doubling, a high power (about 200 milliwatts (mW) or greater) semiconductor laser is essentially a prerequisite. Unfortunately, in both classes of semiconductor laser which have been used in the prior-art for this purpose, increasing power comes at the expense of decreasing beam-quality.

An edge-emitting semiconductor laser, for example, is inherently a high-gain device, as laser light resonates in the plane of the layers forming its active or gain region. As the height (thickness) of these gain-region layers is constrained by electrical confinement and optical confinement considerations, output power must be increased by increasing the width of the gain-region. As the width of the gain-region is increased (to as much as one-hundred times its height in high-power devices), more modes can oscillate, and the output beam becomes highly astigmatic. Accordingly, design of an adequate resonator, for coupling light into an optically-nonlinear crystal therein, as well as for general beam-quality, becomes increasingly more difficult, if not impossible.

A VCSEL is inherently a relatively low gain device, as laser-radiation resonates perpendicular to the plane of the layers forming its active or gain-region. For a relatively small beam diameter, for example about 5 micrometer ($\mu$m) or less, single-mode operation and high beam-quality can be achieved. Gain and output power can be improved in part by increasing the number of active layers in the gain medium. This is somewhat limited by considerations of the properties of materials forming the semiconductor structure. For a further increase in power, however, the area of the emitting surface must be increased. Increasing the emitting surface area to a diameter greater than about 5 $\mu$m inevitably leads, initially, to multimode operation. Further increasing the diameter leads to problems in energizing the laser, as electrical pumping must be supplied laterally. In order to do this uniformly and efficiently, the electrical resistance of semiconductor layers forming the laser must be increased by increased doping. Increased doping, however, reduces the light transmission of the layers and increases resonator loss, such that the purpose of increased doping quickly becomes self-defeating.

There is a need for an intracavity frequency-converted external-cavity semiconductor laser that can provide high, frequency-converted output power together with high beam-quality.

SUMMARY OF THE INVENTION

Shortcomings of prior art IC-doubled external-cavity semiconductor laser are overcome in one aspect of the present invention by using a vertical surface emitting laser in a manner which takes advantage of its inherent good beam-quality, and optically, rather that electrically pumping the laser to deliver high pump power into a small beam diameter thereby providing high fundamental power and correspondingly high frequency-doubled power without sacrificing that beam-quality.

In one preferred embodiment of a vertical cavity semiconductor laser in accordance with the present invention, comprising an epitaxially-grown monolithic semiconductor multilayer structure includes a Bragg-mirror portion and a gain-portion including a plurality of active layers spaced-apart by spacer layers. An external mirror, separated from the semiconductor multilayer structure, is arranged such that it defines a laser resonant-cavity with the Bragg-mirror portion of the monolithic semiconductor multilayer. The laser resonant-cavity includes the gain-portion of the monolithic semiconductor multilayer.

A pump-radiation source is arranged to deliver pump-radiation to the gain-portion of the monolithic semiconductor multilayer structure for generating laser-radiation in the laser resonant-cavity. A frequency-selective (wavelength-selective) element such as a birefringent filter (BRF), an etalon or a dispersive prism is located in the laser resonant-cavity for selecting a frequency (wavelength) of the laser-radiation within a gain bandwidth characteristic of the composition of the gain-portion of the monolithic semiconductor multilayer structure. An optically-nonlinear crystal is located in the resonant-cavity between the birefringent filter and the external mirror and arranged to convert the selected frequency of laser-radiation to a desired converted frequency.

The above described embodiment is preferred for providing single-mode operation for the inventive laser. The wavelength selective element, however, may be omitted to provide for multimode operation. Alternatively, the optically-nonlinear crystal may be omitted to provide a single-mode external-cavity optically-pumped surface-emitting semiconductor laser operating at a fundamental wavelength within the gain-bandwidth of the semiconductor layer structure and selected by the wavelength selective element.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain the principles of the invention.

DETAILED DESCRIPTION OF THE INVENTION

Figure 1:
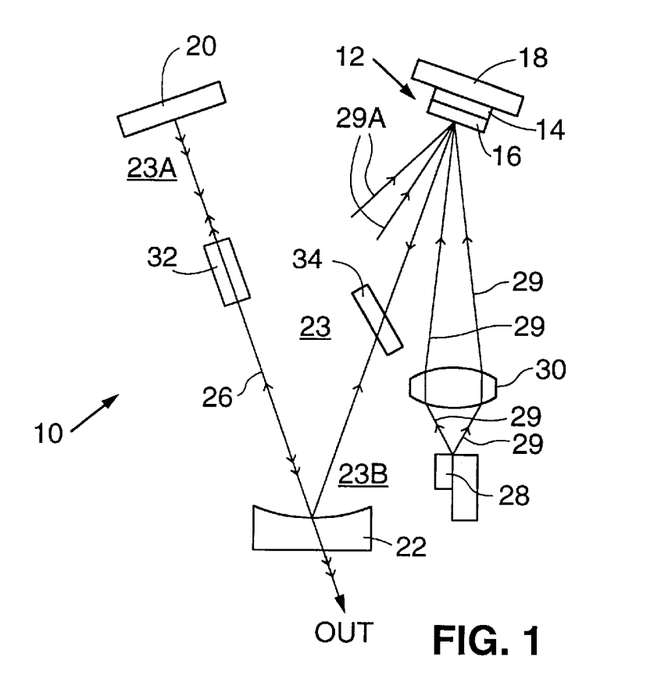
FIG. 1 schematically illustrates one preferred embodiment of an optically-pumped, external-cavity surface-emitting semiconductor laser in accordance with the present invention, having an external resonant-cavity including an optically-nonlinear crystal arranged for frequency doubling.

Turning now to the drawings, wherein like components are designated by like reference numerals, FIG. 1 depicts one preferred embodiment 10 of an optically-pumped IC-doubled vertical cavity laser in accordance with the present invention. Laser 10 includes an epitaxially-grown monolithic semiconductor (surface-emitting) multilayer structure 12 including a Bragg-mirror portion 14, and a gain portion 16 including a plurality of active layers (not shown) spaced apart by spacer-layers (not shown). It should be noted here that the term spacer-layers in the context of this description and the appended claims applies to one or more layers separating the active layers. At least one such layer absorbs optical pump-radiation. Depending on the composition of that layer one or more other layers may be included for strain compensation. Such arrangements are well known in the semiconductor laser art, and any such arrangement is applicable in the context of the present invention. A detailed description of such arrangements is not necessary for understanding principles of the present invention, and, accordingly is not presented herein.

Monolithic semiconductor multilayer structure 12 is bonded to a substrate or heat-sink 18. Monolithic semiconductor multilayer structure 12 may optionally include an antireflection coating (not shown) on an outermost surface (the emitting surface) of gain region 16.

An external mirror 20 and a fold mirror 22 are arranged such that external mirror 20 and Bragg-mirror portion 14 of monolithic semiconductor multilayer structure 12 define laser resonant-cavity 23. Gain-portion 16 of monolithic semiconductor multilayer 12 is thereby incorporated in laser resonant-cavity 23.

A pump-radiation source 24 is arranged to deliver pump-radiation to gain-portion 16 of monolithic semiconductor multilayer structure 12, via the emitting surface thereof, for generating laser-radiation in laser resonant-cavity 23. Fundamental radiation so generated circulates in laser resonant-cavity 23 along the (here, folded) resonator axis 26, as indicated by single arrowheads. Pump-radiation source 24 is preferably an edge-emitting semiconductor diode-laser 28 or an array of such lasers. Other pump light sources coherent or non-coherent may be used without departing from the spirit and scope of the present invention. For simplicity, pump-radiation 29 from diode-laser 28 is depicted in FIG. 1 as a divergent beam impinging directly on a focussing lens 30 to be focussed onto gain portion 16 of monolithic semiconductor multilayer 12. An advantage of the configuration of laser 10 is that pump-radiation can be delivered to gain portion 16 of semiconductor layer structure 12 without traversing any other resonant-cavity component. Another advantage of the configuration of laser 10 is that one on more additional pump-radiation sources may be deployed to direct additional pump-radiation onto gain portion 16 of monolithic semiconductor multilayer 12, as indicated in FIG. 1 by arrows 29A.

Lens 30 is illustrated, for simplicity, in FIG. 1 as a single positive element. Those skilled in the art will recognize that lens 30 may include two or more elements, and will recognize also that one or more cylindrical or anamorphic elements may be required to compensate for inherent astigmatism in beam 29. Those skilled in the art will further recognize, without further illustration, that light from diode-laser 28 may be collected and transported to lens 30 by an optical waveguide or optical-fiber array.

An optically-nonlinear crystal 32 is located in laser resonant-cavity 23 and arranged to double a predetermined frequency of fundamental laser-radiation selected from a spectrum of such frequencies defined by a gain-bandwidth. The frequency-doubled radiation circulates only in arm 23A of laser resonant-cavity 23 as indicated by double arrowheads. The gain-bandwidth is characteristic of the composition of gain region 16 of monolithic semiconductor multilayer 12. Frequency-doubled radiation is extracted from laser resonant-cavity 23 via fold mirror 22, which is coated for high reflectivity at the fundamental wavelength and high transmission at the second harmonic (frequency-doubled) wavelength.

A birefringent filter 34 is located in arm 23B of laser resonant-cavity 23 for selecting the predetermined frequency of the laser-radiation. A frequency (wavelength) selective element such as birefringent filter 34, an uncoated etalon, or a dispersive prism is advantageous in the inventive laser, inter alia, for two reasons.

On one hand, variations in composition of gain region 16 of monolithic semiconductor multilayer 12, due to control tolerances in manufacturing, can be expected to provide a corresponding variation of fundamental frequency. Typically, this variation will not exceed the gain-bandwidth. Accordingly, birefringent filter 34 ensures that fundamental laser-radiation always has the same frequency, despite manufacturing variations in the semiconductor multilayer structure. This is advantageous in itself for reasons of manufacturing quality and consistency in an optically-pumped, external-cavity semiconductor laser, whether or not the laser is intracavity-doubled.

On the other hand, an optically-nonlinear crystal is typically arranged to frequency-double one particular frequency at any instant. As the doubling process constitutes a loss in the laser resonant-cavity, given a gain medium of sufficient gain bandwidth, the resonator will attempt to oscillate at a frequency other than the frequency to be doubled (so-called "wavelength hopping") in order to avoid the loss. The result of this is uncontrolled modulation or noise, if not outright loss of frequency-doubled output. Inclusion of birefringent filter 34 forces laser resonant-cavity 23 to resonate only at the selected frequency to be doubled, thereby forcing frequency-doubling and eliminating noise due to wavelength-hopping.

Optical pumping allows high pump-power to be delivered into a relatively small beam diameter on gain portion 16 of monolithic semiconductor multilayer 12. In this case, given a suitable stable resonator configuration for laser resonant-cavity 23 the resonator will inherently operate in a single-mode. One such resonant-cavity is discussed in detail further hereinbelow. Single-mode operation not only provides high beam-quality, but precludes output-noise phenomena characteristic of uncontrolled multimode operation such as mode-coupling, and sum-frequency generation in optically-nonlinear crystal 32. Accordingly, single-mode operation at high pump-power combined with elimination of wavelength-hopping by BRF 34 assures that high-power, low-noise, frequency-doubled output is available with high beam-quality.

In one preferred example of an IC-doubled optically-pumped semiconductor laser in accordance with the present invention, semiconductor multilayer structure 12 includes a Bragg-mirror portion 14 formed from alternating layers of gallium arsenide (GaAs) and aluminum arsenide (AlAs), and a gain portion 16 including fifteen active layers of indium gallium arsenide (InGaAs), spaced apart by spacer layers of indium gallium arsenide phosphide (InGaAsP). The active layer composition provides fundamental laser-radiation having an output spectrum nominally centered about a wavelength of about 976 nm. Pump light source 24 delivers about 1.0 Watt (W) of pump power at a wavelength of about 808 nm to gain portion 16 of semiconductor multilayer structure 12. Birefringent filter 34 is arranged to select fundamental radiation of 976 nm. Optically-nonlinear crystal 32 is an LBO (lithium tri-borate $LiB_3O_5$) crystal 5.0 mm long and is arranged for type-I phase matching. It should be noted here that while LBO is a preferred optically-linear crystal that any other optically-nonlinear crystal, for example, potassium niobate ($KNbO_3$) or potassium titanyl phosphate (KTP) may be used without departing from the spirit and scope of the present invention.

External mirror 20 is a plane mirror, coated for high reflectivity at the fundamental wavelength and half the fundamental (the harmonic) wavelength. Fold mirror 22 has a radius of curvature of 25.0 mm and is located at about 18 mm from external mirror 20. Fold mirror 22 is coated for high reflectivity at the fundamental wavelength and high transmission at the harmonic wavelength. Semiconductor multilayer structure 12 is located at about 26 mm from fold mirror 22. This resonant-cavity arrangement provides a beam waist between fold mirror 22 and external mirror 20. Optically-nonlinear crystal 32 is located at a position which coincides with the minimum diameter of the beam waist. The beam waist is about 50 $\mu$m in diameter at the $1/e^2$ points. In this example, an output of about 50.0 mW at a wavelength of about 488 nm is obtained.

It should be noted here that an IC-doubled optically-pumped semiconductor laser in accordance with the present invention is not limited to use with materials of the surface-emitting semiconductor multilayer structure exemplified above. Any surface-emitting semiconductor multilayer active layer structure may be used, including, but not limited to, InGaAs/GaAs, AlGaAs/GaAs, InGaAsP/GaAs and InGaN/$Al_2O_3$ (indium gallium nitride/aluminum oxide) lasers. These provide fundamental wavelengths in ranges, respectively, of about 850 to 1100 nm; 700 to 850 nm; 620 to 700 nm; and 425 to 550 nm. Frequency-doubling in accordance with the present invention can thus provide output wavelengths ranging from the green into the ultraviolet portion of the electromagnetic spectrum. Those skilled in the art will recognize that in the foregoing active layer structure designations, the compound to the left of the stroke represents the active layer material, and the compound to the right of the stroke represents the substrate on which the semiconductor layer structure is epitaxially grown.

An IC-doubled optically-pumped semiconductor laser in accordance with the present invention is not limited to the folded resonant-cavity arrangement of FIG. 1. Those skilled in the art will recognize other resonant-cavity arrangements without further illustration which may be utilized in the present invention the present invention. Examples of alternate resonant-cavity arrangements are set forth below.

Figure 2:
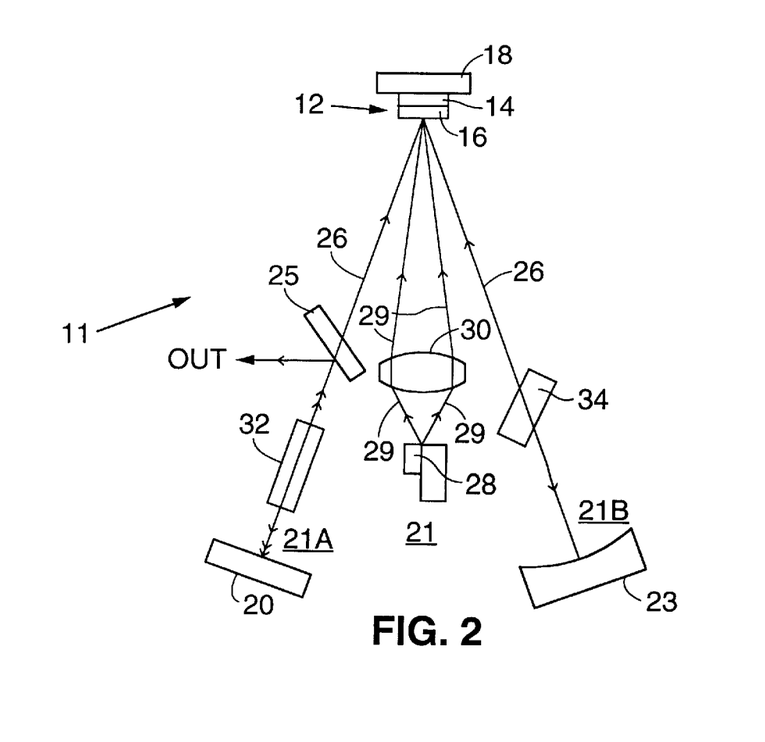
FIG. 2 schematically illustrates another preferred embodiment of an optically-pumped, external-cavity surface-emitting semiconductor laser in accordance with the present invention having an external resonant-cavity including an optically-nonlinear crystal arranged for frequency doubling.

Referring to FIG. 2, another embodiment 11 of an optically-pumped IC-doubled, surface-emitting, semiconductor laser in accordance with the present invention is depicted. Here, a laser resonant-cavity 21 is terminated by a plane external mirror 20 coated for high reflectivity at the fundamental wavelength and the harmonic wavelength, and a concave external mirror 23 coated for maximum reflectivity at the fundamental wavelength. Axis 26 of resonant-cavity 23 is folded by Bragg-mirror portion 14 of semiconductor multilayer structure 12. Pump-radiation is provided to gain portion 16 of semiconductor multilayer structure 12 as described above with reference to laser 10.

A wavelength-selective element 34 and an optically-nonlinear crystal 32 are included in arms 21B and 21A respectively of laser resonant-cavity 21. Frequency-doubled radiation is reflected out of resonant-cavity 21 by a beam-splitter 25 which is coated for high reflectivity at the harmonic wavelength and high transmission at the fundamental wavelength.

Using the semiconductor multilayer structure as a fold mirror as discussed above may be used advantageously to provide additional power in configurations of laser in accordance with the present invention, by folding a resonator two or more times, (in a "Z", "W" or generally zig-zag fashion) using two or more semiconductor multilayer structures 12 (each separately, optically-pumped) as fold mirrors. From the description provided above, such configurations will be apparent to those skilled in the art without further detailed description or illustration.

Figure 3:
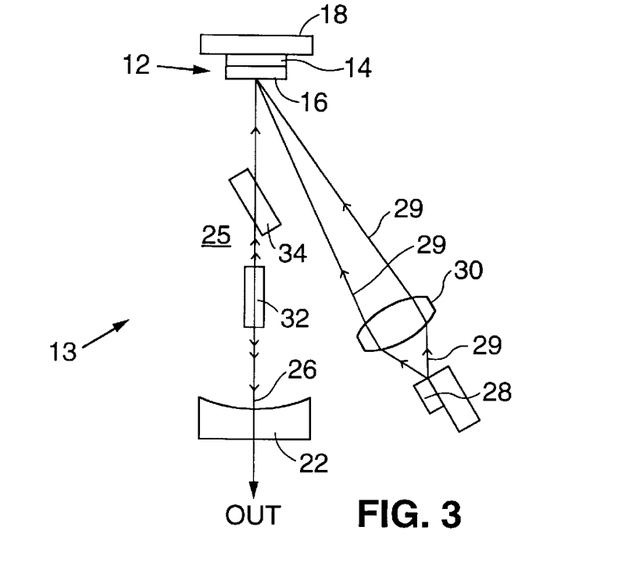
FIG. 3 schematically illustrates yet another preferred embodiment of an optically-pumped, external-cavity surface-emitting semiconductor laser in accordance with the present invention having an external resonant-cavity including an optically-nonlinear crystal arranged for frequency doubling.

Referring now to FIG. 3, yet another embodiment 13 of an optically-pumped, IC-doubled, vertical cavity laser in accordance with the present invention is depicted. Laser 13 includes a straight resonant-cavity 13 terminated by Bragg-mirror portion 14 of semiconductor multilayer structure 12 and a concave mirror 22, which is coated for high reflectivity at the fundamental wavelength and high transmission at the harmonic wavelength, to allow output of frequency-doubled radiation. Resonant-cavity 25 includes an optically-nonlinear crystal 32 and a wavelength-selective element 34, functioning as described above with reference to lasers 10 and 11. Pump-radiation is provided to gain portion 16 of semiconductor multilayer structure 12, as described above with reference to lasers 10 and 11.

Laser 13 is clearly simpler in configuration than above-described lasers 10 and 11, but has a significant disadvantage by comparison in that frequency-doubled radiation generated by (and travelling in the same direction as) fundamental radiation traversing optically-nonlinear crystal 32 in a direction toward semiconductor multilayer structure 12 is essentially entirely lost by absorption in the semiconductor multilayer structure, which is essentially one-hundred percent for the harmonic wavelength. Lasers 10 and 11 are configured, among other reasons, to avoid loss of harmonic radiation in the semiconductor layer structure.

As noted above, inclusion of a wavelength-selective element 34 in an external-cavity optically-pumped external-resonator surface-emitting semiconductor laser is useful in itself, i.e., even in the absence of an intracavity optically-nonlinear crystal, as it can provide a laser of a constant desired frequency, tolerable of the limitations inherent in semiconductor process control. It should also be noted that a separate wavelength-selective element may be omitted if at least one of mirrors 20, 22, or 23 is provided by a highly-selective bandpass-filter such as a high-finesse etalon or the like, used in a reflective mode. In this case the mirror itself may be designated the wavelength-selective element in the context of selecting a particular frequency from a gain-bandwidth.

While IC frequency-converted optically-pumped semiconductor lasers in accordance with the present invention have been described above as IC frequency-doubled lasers, this should not be construed as limiting the present invention. Those skilled in the art will recognize without further detailed description or illustration that principles of the invention are equally applicable for converting to higher harmonic frequencies by the addition of a one or more additional intracavity optically-nonlinear crystals in the resonant-cavity. This may be done, for example, to double the frequency of already-frequency-doubled radiation thereby providing fourth-harmonic radiation, or to mix fundamental and second-harmonic radiation to provide third harmonic radiation.

In an IC frequency-converted optically-pumped semiconductor laser in accordance with the present invention an optically-nonlinear crystal 32 may also be selected and arranged for providing a parametric mixing process and optical parametric oscillation. A parametric mixing process in the non-linear crystal provides optical gain by converting pump-radiation at a fundamental frequency $\omega_{pump}$ to light at optical output (converted) frequencies $\omega_{signal}$ (signal-light or signal-frequency) and $\omega_{idler}$ (idler-frequency). These frequencies have a non-integer relationship with each other and designation of which output frequency is signal-light is arbitrary.

An optical resonant-cavity provides feedback of amplified signal-light which leads to sustained oscillation or resonating of the signal-light, and the production of usable signal-light output. As is well-known in the art, the signal-frequency (and corresponding idler-frequency) may be continuously tuned over a range of frequencies. Tuning may be effected, for example, by adjusting the angle of the optically-nonlinear crystal with respect to the pump beam. One preferred optically-nonlinear crystal material for providing parametric mixing is beta barium borate ($\beta$—$BaB_2O_4$ or BBO).

Figure 4:
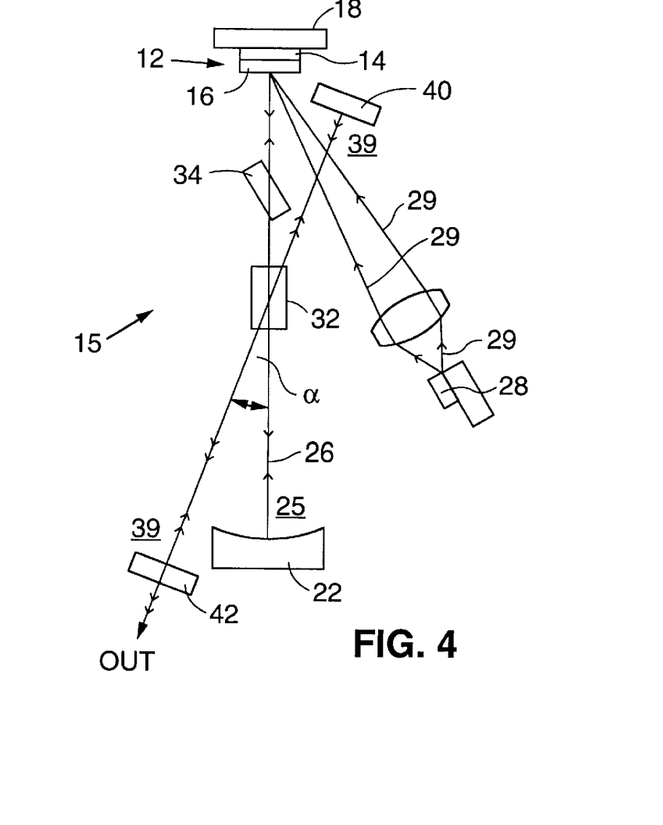
FIG. 4 schematically illustrates still another preferred embodiment of an optically-pumped, external-cavity surface-emitting semiconductor laser in accordance with the present invention having an external resonant-cavity including an optically-nonlinear crystal arranged for non-collinearly pumped optical parametric oscillation.

FIG. 4 depicts still another embodiment 15 of an IC frequency-converted optically-pumped semiconductor laser in accordance with the present invention, wherein optically-nonlinear crystal 32 is arranged for optical parametric oscillation. Laser 15 includes a straight laser resonant-cavity 25, including a wavelength-selective element 34 and an optically-nonlinear crystal 32, and is optically pumped as described above for laser 13 of FIG. 3.

Optical parametric oscillation here is achieved in a so-called non-collinearly pumped arrangement for which a separate resonant-cavity 39 is provided. Resonant-cavity 39 has a resonator axis 41 inclined at an angle $\alpha$ to resonator axis 26 of resonator 25, and is terminated by mirrors (reflectors) 40 and 42. Angle is somewhat exaggerated in FIG. 5 for convenience of illustration. Mirror 40 is highly reflective at the converted-frequency (signal-light wavelength). Mirror 40 is partially reflective and partially transmissive at the signal-light wavelength and serves as an outcoupling mirror for signal-light from resonant-cavity 39.

Figure 5:
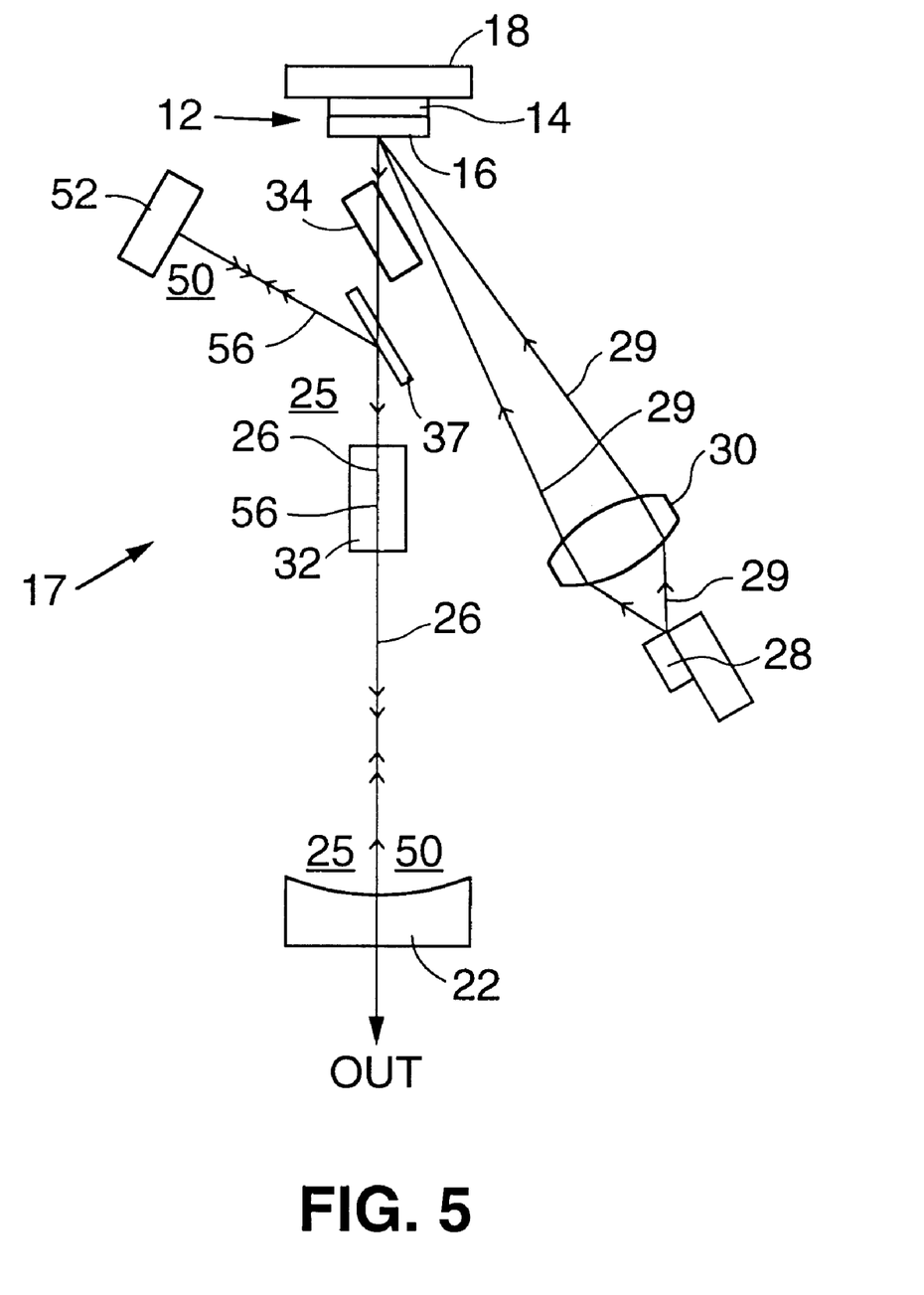
FIG. 5 schematically illustrates a further preferred embodiment of an optically-pumped, external-cavity surface-emitting semiconductor laser in accordance with the present invention having an external resonant-cavity including an optically-nonlinear crystal arranged for collinearly pumped optical parametric oscillation.

Optical parametric oscillation is also possible in so-called collinear pumped arrangements wherein signal-light and pump-light oscillate through the optically-nonlinear crystal generally along a common axis. FIG. 5 depicts such an laser 17. Laser 17 includes a straight laser resonant-cavity 25, including a wavelength-selective element 34 and an optically-nonlinear crystal 32, and is optically pumped as described above for laser 13 of FIG. 3. Also included in resonator 25 is a beamsplitter element 37 coated for high reflectivity at the signal-light wavelength and high transmission at the fundamental wavelength. Cooperative with beamsplitter 37 and mirror 22, which is coated for high reflectivity at both the signal-light and fundamental wavelengths, a mirror 52 coated for high reflectivity at the signal-light wavelength forms an OPO resonator 50. OPO resonator 50 has an axis 56 which is collinear with axis 26 of resonator 25 in optically-nonlinear crystal 32.

Embodiments of lasers in accordance with the present invention discussed above all include a wavelength-selective element for forcing single-mode operation and preventing wavelength hopping. In certain applications, wherein beam-quality, single-mode operation, or noise are not important, the wavelength-selective element may simply be omitted.

The present invention has been described and depicted in terms of a preferred and other embodiments. The invention is not limited, however, to the embodiments described and depicted. Rather, the invention is defined by the claims appended hereto.

What is claimed is:

1. A laser, comprising:

a substrate;

a semiconductor multilayer surface-emitting gain-structure, said gain-structure including a plurality of active layers spaced-apart by spacer layers and said gain structure being supported on said substrate;

a laser resonant-cavity having a resonator axis and being terminated by first and second mirrors, said laser resonant-cavity configured to include said gain-structure with said substrate located outside said laser resonant cavity;

a pump-radiation source arranged to deliver pump-radiation to said gain-structure for generating laser-radiation in said laser resonant-cavity said pump-radiation being delivered to said gain-structure via a surface opposed to said substrate;

a wavelength-selective device located in said laser resonant-cavity for selecting a frequency of said laser-radiation within a gain bandwidth characteristic of the composition of said gain-structure; and an optically-nonlinear crystal located in said resonant-cavity and arranged to convert said selected frequency of laser-radiation to light of at least one different frequency, thereby providing frequency-converted radiation.

2. The laser of claim 1 wherein said wavelength selective device is selected from the group of wavelength selective devices consisting of a birefringent filter, an etalon, and a prism.

3. A laser, comprising:
   a substrate;
   a semiconductor multilayer surface-emitting gain-structure, said gain-structure including a plurality of active layers spaced-apart by spacer layers and said gain structure being supported located outside said laser resonant cavity;
   a laser resonant-cavity having a resonator axis and being terminated by first and second mirrors, said laser resonant-cavity configured to include said gain-structure;
   a pump-radiation source arranged to deliver pump-radiation to said gain-structure for generating laser-radiation in said laser resonant-cavity said pump-radiation being delivered to said gain-structure via a surface opposed to said substrate;
   a wavelength-selective device located in said laser resonant-cavity for selecting a frequency of said laser-radiation within a gain bandwidth characteristic of the composition of said gain-structure; and
   an optically-nonlinear crystal located in said resonant-cavity said optically nonlinear crystal being of a material selected from the group of optically-nonlinear materials consisting of LBO, $KNbO_3$, KTP and BBO, and said optically nonlinear crystal arranged to convert said selected frequency of laser-radiation to light of at least one different frequency, thereby providing frequency-converted radiation.

4. The laser of claim 3 wherein said optically nonlinear crystal is an LBO crystal.

5. The laser of claim 3 wherein said optically nonlinear crystal is a BBO crystal.

6. A laser, comprising:
   a substrate;
   a semiconductor multilayer surface-emitting gain-structure, said gain-structure including a plurality of active layers spaced-apart by spacer layers, said active layers being layers of a material selected from the group of active layer materials consisting of InGaAs, AlGaAs, InGaAsP, and InGaN and said gain structure being supported on said substrate;
   a laser resonant-cavity having a resonator axis and being terminated by first and second mirrors, said laser resonant-cavity configured to include said gain-structure with said substrate located outside said laser resonant cavity;
   a pump-radiation source arranged to deliver pump-radiation to said gain-structure for generating laser-radiation in said laser resonant-cavity said pump-radiation being delivered to said gain-structure via a surface opposed to said substrate;
   a wavelength-selective device located in said laser resonant-cavity for selecting a frequency of said laser-radiation within a gain bandwidth characteristic of the composition of said gain-structure; and
   an optically-nonlinear crystal located in said resonant-cavity and arranged to convert said selected frequency of laser-radiation to light of at least one different frequency, thereby providing frequency-converted radiation.

7. The laser of claim 6 wherein said frequency-converted radiation has a wavelength in a region of the electromagnetic spectrum ranging from the green portion thereof to the ultraviolet portion thereof.

8. The laser of claim 7 wherein said frequency converted radiation has a wavelength in the ultraviolet portion of the electromagnetic spectrum.

9. The laser of claim 7 wherein said frequency converted radiation has a wavelength in the green portion of the electromagnetic spectrum.

10. A laser, comprising:
    a substrate;
    a semiconductor multilayer surface-emitting gain-structure, said gain-structure including a plurality of active layers spaced-apart by spacer layers, said active layers being layers of the group of active layer materials consisting of InGaAs, AlGaAs, and InGaAsP and said gain structure being supported on said substrate;
    a laser resonant-cavity having a resonator axis and being terminated by first and second mirrors, said laser resonant-cavity configured to include said gain-structure with said substrate located outside said laser resonant cavity;
    a pump-radiation source arranged to deliver pump-radiation to said gain-structure for generating laser-radiation in said laser resonant-cavity said pump-radiation being delivered to said gain-structure via a surface opposed to said substrate;
    a wavelength-selective device located in said laser resonant-cavity for selecting a wavelength of said laser-radiation within a gain bandwidth characteristic of the composition of said gain-structure, said wavelength being in a range between about 620 and 1100 nanometers; and
    an optically-nonlinear crystal located in said resonant-cavity and arranged to convert the frequency of selected wavelength of laser-radiation to light of at least one different frequency, thereby providing frequency-converted radiation.

11. A laser, comprising:
    a substrate;
    a semiconductor multilayer surface-emitting gain-structure, said gain-structure including a plurality of active layers spaced-apart by spacer layers and said gain structure being supported on said substrate;
    a laser resonant-cavity having a resonator axis and being terminated by first and second mirrors, said laser resonant-cavity configured to include said gain-structure with said substrate located outside said laser resonant cavity;
    a pump-radiation source arranged to deliver pump-radiation to said gain-structure for generating laser-radiation in said laser resonant-cavity said pump-radiation being delivered to said gain-structure via a surface opposed to said substrate;
    a wavelength-selective device located in said laser resonant-cavity for selecting a frequency of said laser-radiation within a gain bandwidth characteristic of the composition of said gain-structure;
    a first optically-nonlinear crystal located in said resonant-cavity and arranged to double said selected frequency of laser-radiation, thereby providing second-harmonic radiation; and
    a second optically-nonlinear crystal located in said resonant cavity and arranged to double the frequency of said second-harmonic radiation, thereby providing fourth-harmonic radiation.

12. A laser, comprising:
a substrate;
a semiconductor multilayer surface-emitting gain-structure, said gain-structure including a plurality of active layers spaced-apart by spacer layers and said gain structure being supported on said substrate;
a laser resonant-cavity having a resonator axis and being terminated by first and second mirrors, said laser resonant-cavity configured to include said gain-structure with said substrate located outside said laser resonat-cavity;
a pump-radiation source arranged to deliver pump-radiation to said gain-structure for generating laser-radiation in said laser resonant-cavity said pump-radiation being delivered to said gain-structure via a surface opposed to said substrate;
a wavelength-selective device located in said laser resonant-cavity for selecting a frequency of said laser-radiation within a gain bandwidth characteristic of the composition of said gain-structure;
a first optically-nonlinear crystal located in said resonant-cavity and arranged to double said selected frequency of laser-radiation, thereby providing second-harmonic radiation; and
a second optically-nonlinear crystal located in said resonant cavity and arranged to mix said selected frequency of laser-radiation with said second-harmonic radiation, thereby providing third-harmonic radiation.

13. A laser, comprising:
a substrate;
a monolithic structure including a semiconductor multilayer surface-emitting gain-structure surmounting a first mirror, said gain-structure including a plurality of active layers spaced-apart by spacer layers on said monolithic structure being supported on said substrate with said first mirror between said substrate and said gain-structure;
a second mirror separated from said monolithic structure and arranged with said first mirror to define a laser-resonator therebetween said laser-resonator including said gain-structure with said substrate located outside said laser resonant cavity;
said laser-resonator being folded into first and second portions by a third mirror located between said gain-structure and said second mirror, said first portion being between said third mirror and said first mirror, and said second portion being between said third mirror and said second mirror;
a pump-radiation source arranged to deliver pump-radiation to said gain-structure for generating laser-radiation in said laser resonant-cavity said pump-radiation being delivered to said gain-structure via a surface opposed to said substrate;
a wavelength-selective device located in said laser resonant-cavity for selecting a frequency of said laser-radiation within a gain bandwidth characteristic of the composition of said gain-structure;
an optically-nonlinear crystal located in said resonant-cavity and arranged to convert said selected frequency of laser-radiation to light of a different frequency, thereby providing frequency-converted radiation; and
wherein said optically-nonlinear crystal is located in said second portion of said laser-resonator and said third mirror is transparent to said frequency-converted radiation.

14. The laser of claim 13 wherein said wavelength-selective device is located in said first portion of said laser-resonator.

15. The laser of claim 14 wherein said wavelength-selective device is selected from the group of wavelength-selective devices consisting of a birefringent-filter, an etalon, and a prism.

16. The laser of claim 15 wherein said wavelength-selective device is a birefringent-filter.

17. The laser of claim 13 wherein said optically-nonlinear crystal is arranged to frequency-double said selected frequency of laser radiation, and said frequency-converted radiation is second-harmonic radiation of said selected frequency of laser-radiation.

18. The laser of claim 13 wherein said laser-resonator further includes an additional optically-nonlinear crystal arranged the to mix said selected frequency of laser-radiation with said second-harmonic radiation thereby providing third-harmonic radiation.

19. The laser of claim 13 wherein said laser-resonator further includes an additional optically-nonlinear crystal arranged the to double the frequency of said second-harmonic radiation thereby providing fourth-harmonic radiation.

20. A laser, comprising:
a substrate;
a monolithic structure including a semiconductor multilayer surface-emitting gain-structure surmounting a first mirror, said gain-structure including a plurality of active layers spaced-apart by spacer layers, said active layers being layers of a material selected from the group of the group of active-layer materials consisting of InGaAs, AlGaAs, InGaAsP, and InGaN and said monolithic structure being supported on said substrate with said first mirror between said substrate and said gain-structure;
a second mirror separated from said monolithic structure and arranged with said first mirror to define a laser-resonator therebetween said laser-resonator including said gain-structure with said substrate located outside said laser resonant cavity;
said laser-resonator being folded into first and second portions by a third mirror located between said gain-structure and said second mirror, said first portion being between said third mirror and said first mirror, and said second portion being between said third mirror and said second mirror;
a pump-radiation source arranged to deliver pump-radiation to said gain-structure for generating laser-radiation in said laser resonant-cavity said pump-radiation being deleivered to said gain-structure via a surface opposed to said substrate;
a wavelength-selective device located in said first portion of said laser resonant-cavity for selecting a frequency of said laser-radiation within a gain bandwidth characteristic of the composition of said gain-structure, said wavelength-selective device selected from the group of wavelength-selective devices consisting of a birefringent-filter, an etalon, and a prism;
an optically-nonlinear crystal located in said second portion of said laser-resonator and arranged to convert said selected frequency of laser-radiation, to light of a different frequency, thereby providing frequency-converted radiation; and
wherein said third mirror is transparent to said frequency-converted radiation.

21. The laser of claim 20 wherein said frequency-converted radiation has a wavelength in a region of the electromagnetic spectrum ranging from the green portion thereof to the ultraviolet portion thereof.

22. The laser of claim 21 wherein said frequency-converted radiation has a wavelength in the ultraviolet portion of the electromagnetic spectrum.

23. The laser of claim 21 wherein said frequency-converted radiation has a wavelength in the green portion of the electromagnetic spectrum.

24. A laser, comprising:

a substrate;

a monolithic structure including a semiconductor multi-layer surface-emitting gain-structure surmounting a first mirror, said gain-structure including a plurality of active layers spaced-apart by spacer layers, said active layers being layers of InGaAs and said monolithic structure being supported on said substrate with said first mirror between said substrate and said gain-structure;

a second mirror separated from said monolithic structure and arranged with said first mirror to define a laser-resonator therebetween said laser-resonator including said gain-structure with said substrate located outside said laser resonant cavity;

said laser-resonator being folded into first and second portions by a third mirror located between said gain-structure and said second mirror, said first portion being between said third mirror and said first mirror, and said second portion being between said third mirror and said second mirror;

a pump-radiation source arranged to deliver pump-radiation to said gain-structure for generating laser-radiation in said laser resonant-cavity said pump-radiation being delivered to said gain-structure via a surface opposed to said substrate;

a birefringent-filter located in said first portion of said laser resonant-cavity and arranged to select a wavelength of said laser-radiation of about 976 nm;

an optically-nonlinear crystal located in said second portion of said laser-resonator and arranged to double the frequency of said selected wavelength of laser-radiation, thereby providing frequency-converted radiation having a wavelength of about 488 nm; and wherein said second mirror is transparent to said frequency-converted radiation and serves to deliver said frequency converted radiation from said laser-resonator.

25. A laser, comprising:

a substrate;

a monolithic structure including a semiconductor multi-layer surface-emitting gain-structure surmounting a first mirror, said gain-structure including a plurality of active layers spaced-apart by spacer layers and said monolithic structure being supported on said substrate with said first mirror between said substrate and said gain-structure;

a second mirror separated from said monolithic structure and arranged with said first mirror to define a laser-resonator therebetween said laser-resonator including said gain-structure with said substrate located outside said laser resonant cavity;

a pump-radiation source arranged to deliver pump-radiation to said gain-structure for generating laser-radiation in said laser resonant-cavity said pump-radiation being delivered to said gain-structure via a surface opposed to said substrate;

a wavelength-selective device located in said laser resonant-cavity for selecting a frequency of said laser-radiation within a gain bandwidth characteristic of the composition of said gain-structure;

an optically-nonlinear crystal located in said resonant-cavity and arranged to convert said selected frequency of laser-radiation to light of a different frequency, thereby providing frequency-converted radiation; and wherein said laser-resonator is configured to minimize incidence of said frequency-converted radiation on said gain-structure.

26. The laser of claim 25 wherein said laser-resonator is folded into first and second portions by a third mirror located between said gain-structure and said second mirror, said first portion of said laser-resonator being between said third mirror and said first mirror, and said second portion of said laser-resonator being between said third mirror and said second mirror, said wavelength selective device being located in said second portion of said laser-resonator and said third mirror being transparent to said frequency converted radiation.

27. A method of generating light having a preselected wavelength falling within the range of 550 nm to 310 nm or 275 nm to 215 nm comprising the steps of:

(a) providing a substrate;

(b) fabricating a semiconductor multilayer surface-emitting gain-structure, said gain-structure including a plurality of active layers, said active-layers having a characteristic laser-radiation emission wavelength falling within the region of 1100 nm to 620 nm or 550 to 425 nm, said active-layers being selected such that said characteristic laser-radiation emission wavelength thereof is twice the preselected wavelength;

(c) supporting said gain-structure in said substrate;

(d) arranging said gain-structure in a laser-resonator with said substrate outside of the laser resonator;

(e) positioning an optically-nonlinear element within the laser-resonator;

(f) optically pumping said gain-structure via a surface opposed to the substrate with a diode-laser located outside the laser-resonator and having an output matched to an absorption in said gain-portion of said semiconductor multilayer structure, thereby causing laser-radiation having said characteristic emission wavelength to circulate in said laser-resonator through said optically non-linear element, and whereby said laser-radiation is frequency doubled by the non-linear optical element thereby providing light having the preselected wavelength; and (g) delivering said preselected-wavelength light from said laser-resonator.

28. A method of generating light having a preselected wavelength falling within the range of 550 nm to 310 nm or 275 nm to 215 nm comprising the steps of:

(a) providing a substrate;

(b) fabricating a semiconductor multilayer surface-emitting gain-structure, said gain-structure including a plurality of active layers spaced-apart by spacer layers, said active layers being layers of a material selected from the group of active-layer materials consisting of InGaAs, AlGaAs, InGaAsP and InGaN, said active-layer materials having characteristic output wavelengths falling within the region of 1100 nm to 850 nm, 850 nm to 700 nm, 700 nm to 620 nm and 550 to 425 nm respectively, said active-layer material being selected to have a characteristic laser-radiation emission wavelength of twice the preselected wavelength;

(c) supporting said gain-structure on said substrate;

(d) arranging said gain-structure in a laser-resonator with said substrate outside of the laser resonator;

(e) positioning an optically-nonlinear element within the laser-resonator;

(f) optically pumping said gain-structure via a surface opposed to the substrate with a diode-laser located outside the laser-resonator and having an output matched to an absorption in said gain-portion of said semiconductor multilayer structure, thereby causing laser-radiation having said emission wavelength to circulate in said laser-resonator through said optically non-linear element, and whereby said laser-radiation is frequency doubled by the non-linear optical element thereby providing light having the preselected wavelength; and (g) delivering said preselected-wavelength light from said laser-resonator.

29. The method of claim 28 further including the step of positioning a wavelength selective device within the laser-resonator for maintaining said circulating laser-radiation at said characteristic emission wavelength.

30. A method of generating light having a preselected wavelength falling within the range of 550 nm to 310 nm or 275 nm to 215 nm comprising the steps of:

(a) providing a substrate;

(b) fabricating a semiconductor multilayer surface-emitting gain-structure, said gain-structure including a plurality of active layers spaced-apart by spacer layers, said active layers being layers of a material selected from the group of active-layer materials consisting of InGaAs, AlGaAs, InGaAsP and InGaN, said active-layer materials having characteristic output wavelengths falling within the region of 1100 nm to 850 nm, 850 nm to 700 nm, 700 nm to 620 nm and 550 to 425 nm respectively, said active-layer material being selected to have a characteristic laser-radiation emission wavelength of three times the preselected wavelength;

(c) supporting said gain-structure on said substrate;

(d) arranging said gain-structure in a laser-resonator with said substrate outside of the laser resonator;

(e) positioning first and second optically-nonlinear elements within the laser-resonator;

(f) optically pumping said gain-structure via a surface opposed to the substrate with a diode-laser located outside the laser-resonator and having an output matched to an absorption in said gain-portion of said semiconductor multilayer structure, thereby causing laser-radiation having said emission wavelength to circulate in said laser-resonator through said optically-nonlinear elements, and whereby said laser-radiation is frequency doubled by the first optically-nonlinear element and frequency tripled by the second optically-nonlinear element thereby providing light having the selected wavelength; and (g) delivering said preselected-wavelength light from said laser-resonator.

31. A method of generating light having a preselected wavelength falling within the range of 550 nm to 310 nm or 275 nm to 215 nm comprising the steps of:

(a) providing a substrate;

(b) fabricating a semiconductor multilayer surface-emitting gain-structure, said gain-structure including a plurality of active layers spaced-apart by spacer layers, said active layers being layers of a material selected from the group of active-layer materials consisting of InGaAs, AlGaAs, InGaAsP and InGaN, said active-layer materials having characteristic output wavelengths falling within the region of 1100 nm to 850 nm, 850 nm to 700 nm, 700 nm to 620 nm and 550 to 425 nm respectively, said active-layer material being selected to have a characteristic laser-radiation emission wavelength of four times the preselected wavelength;

(c) supporting said gain-structure on said substrate;

(d) arranging said gain-structure in a laser-resonator with said substrate outside of the laser resonator;

(e) positioning first and second optically-nonlinear elements within the laser-resonator;

(g) optically pumping said gain-structure via a surface opposed to the substrate with a diode-laser located outside the laser-resonator and having an output matched to an absorption in said gain-structure, thereby generating laser-radiation having said emission wavelength to circulate in said laser-resonator through said optically-nonlinear elements, and whereby said laser-radiation is frequency doubled by the first optically-nonlinear element and said frequency-doubled laser-radiation is frequency quadrupled by the second optically-nonlinear element thereby providing light having the preselected wavelength; and (f) delivering said preselected-wavelength light from said laser-resonator.

* * * * *